United States Patent
Adachi et al.

(10) Patent No.: US 7,560,363 B2
(45) Date of Patent: Jul. 14, 2009

(54) MANUFACTURING METHOD FOR SIMOX SUBSTRATE

(75) Inventors: Naoshi Adachi, Tokyo (JP); Yukio Komatsu, Tokyo (JP)

(73) Assignee: Sumco Corporation, Tokyo (JP)

( * ) Notice: Subject to any disclaimer, the term of this patent is extended or adjusted under 35 U.S.C. 154(b) by 295 days.

(21) Appl. No.: 11/632,875

(22) PCT Filed: Jul. 19, 2005

(86) PCT No.: PCT/JP2005/013259

§ 371 (c)(1), (2), (4) Date: Jan. 19, 2007

(87) PCT Pub. No.: WO2006/009148

PCT Pub. Date: Jan. 26, 2006

(65) Prior Publication Data

US 2008/0090384 A1    Apr. 17, 2008

(30) Foreign Application Priority Data

Jul. 20, 2004    (JP) .............................. 2004-211127

(51) Int. Cl.
*H01L 21/00* (2006.01)
(52) U.S. Cl. .................. 438/473; 438/455; 438/400
(58) Field of Classification Search .................. 438/473, 438/455, 400
See application file for complete search history.

(56) References Cited

U.S. PATENT DOCUMENTS

| 5,935,320 | A | | 8/1999 | Graef et al. |
|---|---|---|---|---|
| 6,143,629 | A | * | 11/2000 | Sato ............................. 438/455 |
| 6,617,034 | B1 | | 9/2003 | Hamaguchi et al. |
| 6,632,694 | B2 | * | 10/2003 | Torvik ........................... 438/22 |
| 6,734,762 | B2 | * | 5/2004 | Cornett et al. ............... 333/186 |
| 6,927,146 | B2 | * | 8/2005 | Brask et al. .................. 438/458 |
| 6,927,422 | B2 | * | 8/2005 | Torvik ........................... 257/85 |
| 7,183,229 | B2 | * | 2/2007 | Yamanaka .................... 438/795 |
| 7,407,868 | B2 | * | 8/2008 | Brask et al. .................. 438/458 |
| 2002/0145489 | A1 | * | 10/2002 | Cornett et al. ............... 333/197 |
| 2003/0013280 | A1 | * | 1/2003 | Yamanaka .................... 438/487 |
| 2003/0071275 | A1 | * | 4/2003 | Torvik ........................... 257/184 |

(Continued)

FOREIGN PATENT DOCUMENTS

JP    64-072533    3/1989

(Continued)

OTHER PUBLICATIONS

The extended European Search Report from corresponding European application No. EP05762053, issued on Jul. 2, 2008.

*Primary Examiner*—Laura M Menz
(74) *Attorney, Agent, or Firm*—Kolisch Hartwell, PC

(57) ABSTRACT

A manufacturing method for a SIMOX substrate for obtaining a SIMOX substrate by subjecting a silicon substrate having oxygen ions implanted thereinto by heat treatment at 1300 to 1350° C. in an atmosphere of a gas mixture of argon and oxygen, the method includes: performing a pre-heat-treatment to the silicon substrate for five minutes to four hours within the temperature range of 1000° C. to 1280° C. in an atmosphere of inert gas, reducing gas, or a gas mixture of inert gas and reducing gas, after the oxygen ions are implanted and before the heat treatment is performed.

2 Claims, 3 Drawing Sheets

EXAMPLE 1

U.S. PATENT DOCUMENTS

| | | | |
|---|---|---|---|
| 2004/0259324 A1* | 12/2004 | Brask et al. | 438/455 |
| 2005/0082554 A1* | 4/2005 | Torvik | 257/85 |
| 2005/0181612 A1* | 8/2005 | Brask et al. | 438/689 |
| 2007/0045738 A1* | 3/2007 | Jones et al. | 257/347 |
| 2007/0087492 A1* | 4/2007 | Yamanaka | 438/166 |
| 2007/0196995 A1* | 8/2007 | Aoki et al. | 438/400 |
| 2008/0044669 A1* | 2/2008 | Adachi | 428/446 |
| 2008/0090384 A1* | 4/2008 | Adachi et al. | 438/473 |
| 2008/0190910 A1* | 8/2008 | Shimada et al. | 219/390 |
| 2008/0251879 A1* | 10/2008 | Adachi et al. | 257/506 |

FOREIGN PATENT DOCUMENTS

| | | |
|---|---|---|
| JP | 05-335301 | 12/1993 |
| JP | 07-193072 | 7/1995 |
| JP | 10-064837 | 3/1998 |
| JP | 10-098047 | 4/1998 |
| JP | 11-040512 | 2/1999 |
| JP | 11040512 A * | 2/1999 |
| JP | 11-220019 | 8/1999 |
| JP | 2001-223220 | 8/2001 |
| JP | 09-293846 A | 11/2007 |

* cited by examiner

OXYGEN-ION-IMPLANTATION STEP

PRE-HEAT-TREATMENT STEP

MANUFACTURING METHOD FOR SIMOX SUBSTRATE

BACKGROUND OF THE INVENTION

1. Field of the Invention

The present invention relates to a manufacturing method for a SIMOX substrate for obtaining a SIMOX substrate by subjecting an oxygen-ion-implanted silicon substrate to heat treatment.

This application claims priority from Japanese Patent Application No. 2004-211127 filed on Jul. 20, 2004, the content of which is incorporated herein by reference.

2. Background Art

Known SOI substrates having a single-crystal silicon layer on an insulator such as silicon oxide include SIMOX substrates. SIMOX substrates are SOI substrates where oxygen ions are implanted into a single-crystal silicon substrate and then a high-temperature heat treatment is carried out in an oxidizing atmosphere to cause chemical reactions between the implanted oxygen ions and silicon atoms so that a buried oxide film is formed. Because devices formed on these SOI layers achieve high radioresistance, latch-up resistance, control of a short channel effect, and low-power-consumption operation, SOI substrates are expected as next-generation high-performance semiconductor substrates.

In general, for mirror-polished substrates produced by processing a silicon single crystal grown by the Czochralski method, crystal defects, such as COPs (Crystal Originated Particles), introduced during silicon growth are known to contribute to degradation in the resistance characteristic of a gate oxide film. For this reason, device manufacturers provide an improvement in yield due to poor insulation of a gate oxide film by using substrates with low crystal defect density, such as silicon epitaxial growth substrates or substrates with significantly reduced crystal defects that are grown at a low pull rate.

The same also applies to SOI substrates, and similarly for SIMOX substrates, any COPs or void defects existing on or near the substrate surface bring about, for example, a pinhole defect on a SOI layer surface of the finished product, thus degrading device characteristics. A manufacturing method for a SIMOX substrate is proposed which is free of pinhole defects on this SOI layer surface by using a silicon single crystal which includes $1\times10^{14}$ atoms/cm$^3$ to $1\times10^{17}$ atoms/cm$^3$ of nitrogen (refer to, for example, Japanese Unexamined Patent Application, First Publication No. H10-64837). In this manufacturing method for a SIMOX substrate where oxygen ions were implanted into a silicon substrate including nitrogen, heat treatment was performed at 1350° C. in 0.5% oxygen gas for four hours, and heat treatment was continued for another four hours at an oxygen concentration of 70%, it is reported that there were no pits (called thermal pits) measuring greater than or equal to 0.3 µm in size on a SOI layer surface.

It is true that there were substantially no thermal pits measuring greater than or equal to 0.3 µm in size on the SOI layer surface of the silicon substrate including nitrogen into which oxygen ions were implanted and which were then subjected to heat treatment. However, it has been found that defects smaller than 0.3 µm in size existed at high density near the surface. In other words, this phenomenon indicates that crystal defects are not eliminated in an atmosphere including a very low concentration of oxygen, and therefore, the above-described known manufacturing method has a problem in that defects of smaller than 0.3 µm in size cannot be eliminated.

SUMMARY OF THE INVENTION

This invention provides a manufacturing method for a SIMOX substrate in which relatively small defects on a SOI layer surface can be eliminated.

A manufacturing method according to this invention is an improved version of the method for manufacturing a SIMOX substrate for obtaining a SIMOX substrate by subjecting an oxygen-ion-implanted silicon substrate to heat treatment at 1300 to 1350° C. in an atmosphere of a gas mixture of argon and oxygen.

This method includes performing a pre-heat-treatment to the silicon substrate for five minutes to four hours within the temperature range of 1000° C. to 1280° C. in an atmosphere of inert gas, reducing gas, or a gas mixture of inert gas and reducing gas, after the oxygen ions are implanted and before the heat treatment is performed.

In the manufacturing method for a SIMOX substrate according to this invention, an inner-wall oxide film of crystal defects resulting from heat treatment in an atmosphere of non-oxidizing gas, particularly void defects called grown-in defects, is dissolved by subjecting the silicon substrate to pre-heat-treatment after oxygen ions have been implanted and before heat treatment is carried out, and thereafter grown-in defects adjacent to the surface are reduced and eliminated by drawing upon a gap-filling effect by diffusion of interstitial silicon atoms in void defects where the inner-wall oxide film has been removed. In this manner, defects of smaller than 0.3 µm in size can also be eliminated.

Furthermore, in the manufacturing method for a SIMOX substrate, the above-described silicon substrate into which oxygen ions are implanted may have crystal defect densities of void defects or COPs greater than or equal to $1\times10^5$ cm$^{-3}$ and a maximum frequency less than or equal to 0.12 µm in the size distribution of crystal defects.

In this case, since a substrate having small crystal defects is used, the variation in oxygen ion ranges is small. Therefore, only a minor variation in buried oxide films resulting from heat treatment in an atmosphere of a gas mixture of argon and oxygen can occur in the subsequent step.

The manufacturing method for a SIMOX substrate, may include: decreasing the temperature of the silicon substrate to 600° C. to 1100° C. in an atmosphere of inert gas, reducing gas, or a gas mixture of inert gas and reducing gas, after the pre-heat-treatment; and performing the heat treatment in an atmosphere of a gas mixture of argon and oxygen, after the decreasing of the temperature of the silicon substrate.

In general, when heat treatment at a temperature less than or equal to 1250° C. in an atmosphere of non-oxidizing gas is completed at the initial stage and then the atmosphere is switched to an atmosphere of a gas mixture of argon and oxygen at that temperature, degradation of microroughness on the silicon substrate surface occurs. According to the invention in this case, however, the temperature is decreased to a level that can prevent degradation of microroughness, more specifically, less than or equal to 1100° C. after the pre-heat-treatment, drastic degradation of roughness can be prevented.

In the manufacturing method for a SIMOX substrate according to this invention, since the silicon substrate is subjected to pre-heat-treatment for five minutes to four hours within a temperature range of 1000° C. to 1280° C. in an atmosphere of inert gas, reducing gas, or a gas mixture of inert gas and reducing gas after oxygen ions have been implanted and before heat treatment is carried out, an inner-wall oxide film of crystal defects resulting from heat treatment in an atmosphere of non-oxidizing gas, particularly void defects called grown-in defects, is dissolved. Thereafter, grown-in defects adjacent to the surface are reduced and eliminated by drawing upon a gap-filling effect by diffusion of interstitial silicon atoms in void defects where the inner-wall oxide film has been removed. In this case, if the above-described silicon substrate into which oxygen ions are implanted have crystal defect densities of void defects or COPs greater than or equal to $1 \times 10^5$ cm$^{-3}$ and a maximum frequency less than or equal to 0.12 μm in the size distribution of the crystal defects, a substrate having small crystal defects is used, and therefore, the variation in oxygen ion ranges is small. Consequently, only a minor variation in buried oxide films resulting from heat treatment in an atmosphere of a gas mixture of argon and oxygen can occur in the subsequent step. On the other hand, when heat treatment at a temperature less than or equal to 1250° C. in an atmosphere of non-oxidizing gas is completed at the initial stage and then the atmosphere is switched to an atmosphere of a gas mixture of argon and oxygen at that temperature, degradation of microroughness on the silicon substrate surface occurs. However, if the temperature is decreased to a level that can prevent degradation of microroughness, more specifically, less than or equal to 1100° C. after the pre-heat-treatment, drastic degradation of roughness can be prevented.

DESCRIPTION OF THE PREFERRED EMBODIMENTS

Figure 1:
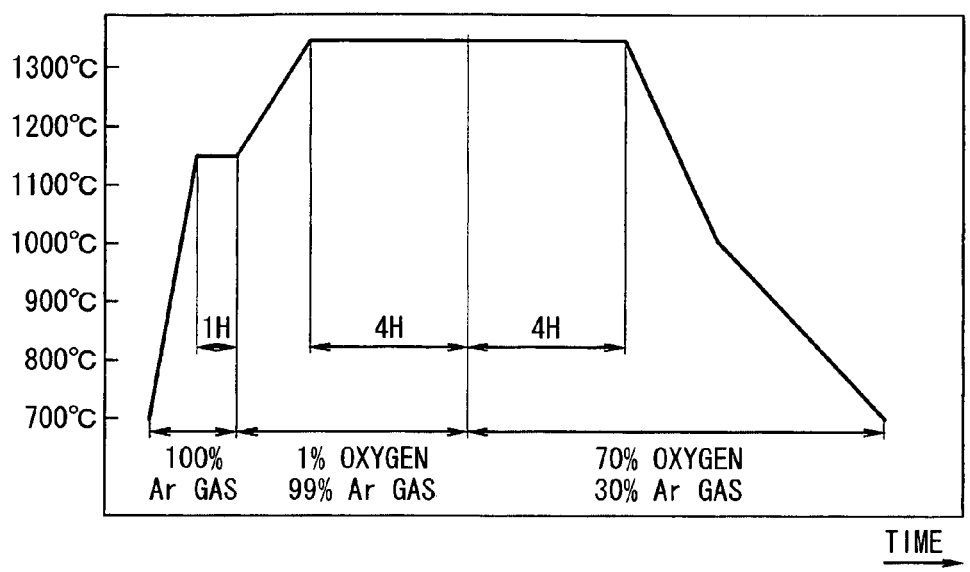
FIG. 1 is a diagram depicting temperature conditions in Example 1 according to an embodiment of this invention.

Preferred embodiments of this invention will be described with reference to the drawings.

This invention relates to a manufacturing method for a SIMOX substrate for obtaining a SIMOX substrate by subjecting an oxygen-ion-implanted silicon substrate to heat treatment at 1300° C. to 1350° C. in the atmosphere of a gas mixture of argon and oxygen. This method is characterized by applying pre-heat-treatment to the silicon substrate for five minutes to four hours within the temperature range of 1000° C. to 1280° C. in an atmosphere of inert gas, reducing gas, or a gas mixture of inert gas and reducing gas, after oxygen ions have been implanted and before the heat treatment is carried out. First, oxygen ions are implanted to form an oxide film. Then, as preprocessing of conventional heat treatment in an atmosphere of a gas mixture of argon and oxygen, heat treatment is carried out in an atmosphere of inert gas, reducing gas, or a gas mixture of inert gas and reducing gas to eliminate small crystal defects that result in pits. Then, an inner-wall oxide film of crystal defects resulting from heat treatment in an atmosphere of non-oxidizing gas, particularly void defects called grown-in defects, is dissolved to reduce and eliminate grown-in defects adjacent to the surface by drawing upon a gap-filling effect by diffusion of interstitial silicon atoms in void defects where the inner-wall oxide film has been removed. At this time, since silicon- or silica-based particles adhering as a result of ion implantation can also be reduced or removed together, the number of pits on the final SIMOX substrate surface can be further reduced.

Here, the inert gas includes argon gas, helium gas, or the like, and the reducing gas includes hydrogen gas. The atmosphere of a gas mixture of inert gas and reducing gas includes, for example, an atmosphere of a gas mixture of hydrogen and argon or an atmosphere of a gas mixture of helium and hydrogen. The mixing ratio in this case is not particularly limited.

Furthermore, the pre-heat-treatment is carried out within the temperature range of 1000° C. to 1280° C. for five minutes to four hours because it is necessary to dissolve an inner-wall oxide film of crystal defects resulting from heat treatment in an atmosphere of non-oxidizing gas, particularly void defects called grown-in defects, and then reduce and eliminate grown-in defects adjacent to the surface by drawing upon a gap-filling effect by diffusion of interstitial silicon atoms in void defects where the inner-wall oxide film has been removed. If the pre-heat-treatment was performed at temperatures less than 1000 degrees, it would be difficult to eliminate crystal defects. If the pre-heat-treatment were performed at temperatures more than 1280° C., sublimation of silicon atoms on the silicon surface would be significant, which leads to degradation of roughness on the silicon substrate surface. Here, a preferable temperature range is from 1100° C. to 1250° C. If the pre-heat-treatment were performed for less than five minutes, it would be difficult to eliminate crystal defects sufficiently. If the pre-heat-treatment were continued for more than four hours, the buried oxide film would deteriorate due to sublimation of silicon atoms and out diffusion of ion-implanted oxygen ions. Here, it is preferable that the pre-heat-treatment be performed for 30 minutes to 2 hours.

Furthermore, it is preferable that the silicon substrate into which oxygen ions are implanted have crystal defect densities of void defects or COPs greater than or equal to $1 \times 10^5$ cm$^{-3}$ and a maximum frequency less than or equal to 0.12 μm in the size distribution of crystal defects. In other words, if a substrate having small crystal defects is used, the variation in oxygen ion ranges is small, and therefore, only a minor variation in buried oxide films resulting from heat treatment in an atmosphere of a gas mixture of argon and oxygen can occur in the subsequent step. Here, the crystal defect density needs to be greater than or equal to $1 \times 10^5$ cm$^{-3}$ because, if the crystal defect density were less than $1 \times 10^5$ cm$^{-3}$, the size of crystal defects would be increased, making it difficult to eliminate the defects during pre-heat-treatment. A preferable defect density is $1 \times 10^5$ cm$^3$ to $1 \times 10^7$ cm$^{-3}$. Furthermore, the maximum frequency in the size distribution of crystal defects needs to be less than or equal to 0.12 μm because, if the maximum frequency exceeds 0.12 μm, it would be difficult to eliminate crystal defects sufficiently. A more preferable maximum frequency is less than or equal to 0.07 μm.

On the other hand, it is known that when heat treatment at a temperature less than or equal to 1250° C. in an atmosphere of non-oxidizing gas is completed at the initial stage and then the atmosphere is switched to an atmosphere of a gas mixture of argon and oxygen at that temperature, degradation of microroughness on the silicon substrate surface occurs. Therefore, it is preferable that, after the pre-heat-treatment, the temperature of the silicon substrate be decreased to 600° C. to 1100° C. in an atmosphere of inert gas, reducing gas, or a gas mixture of inert gas and reducing gas before the heat treatment in an atmosphere of a gas mixture of argon and oxygen is performed. In short, a roughness level similar to that of normal SIMOX products is achieved by decreasing the temperature to a level that can prevent degradation of microroughness, more specifically, less than or equal to 1100° C. and introducing oxidizing gas to perform heat treatment for forming a buried oxide film.

Figure 4A:
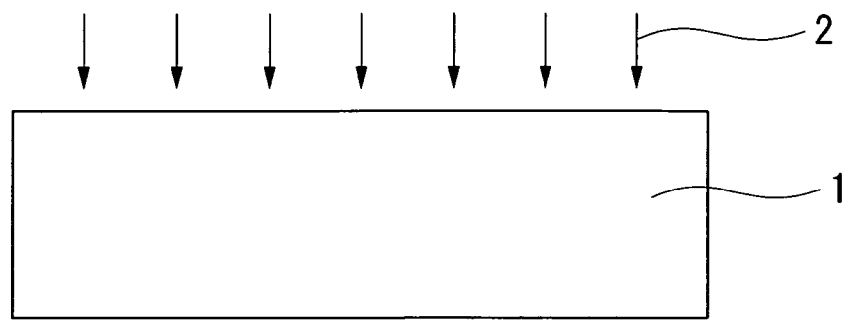
FIG. 4 is a diagram showing process steps in an embodiment according to an embodiment of this invention.
Figure 4B:
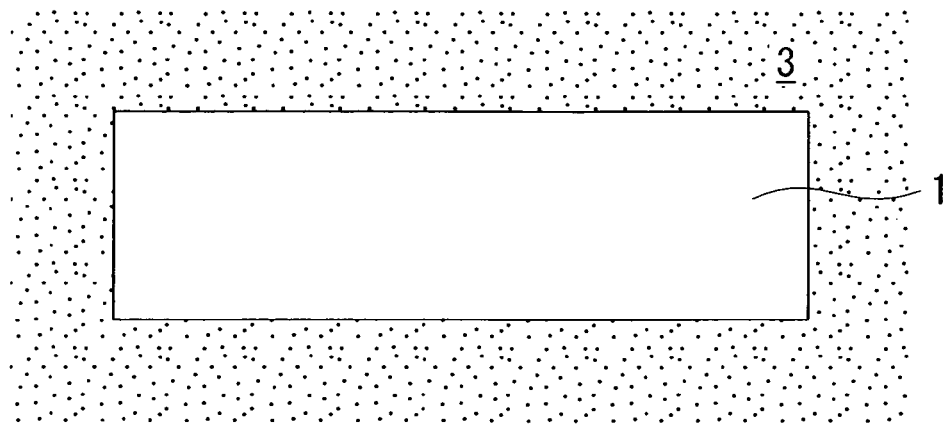

The above-described manufacturing method for a SIMOX substrate includes an oxygen-ion-implantation step and a pre-heat-treatment step, as shown in, for example, the diagram showing process steps of FIGS. 4A and 4B. As shown in FIG. 4A, oxygen ions 2 are first implanted into a silicon substrate 1. Then, as shown in FIG. 4B, the silicon substrate is subjected to pre-heat-treatment for five minutes to four hours within a temperature range of 1000° C. to 1280° C. in an atmosphere 3 of inert gas, reducing gas, or a gas mixture of inert gas and reducing gas.

EXAMPLE 1

As initial materials, the following three types of substrates obtained by processing silicon single crystal of 200 mm in diameter grown by the Czochralski method were prepared. More specifically, (1) a substrate having a maximum crystal defect size of 0.13 to 0.15 μm and a maximum density of $0.5 \times 10^4$ cm$^{-2}$, (2) a substrate having a maximum crystal defect size of 0.09 to 0.12 μm and a maximum density of $1.0 \times 10^5$ cm$^{-2}$, and (3) a substrate having a maximum crystal defect size of 0.05 to 0.07 μm and a maximum density of $1.0 \times 10^7$ cm$^{-2}$ were prepared.

Oxygen ions were implanted into these three types of substrates with an implantation energy of 180 KeV and a dosage of $4.0 \times 10^{17}$ cm$^{-2}$. Next, as shown in FIG. 1, a temperature of 700° C. was achieved in an atmosphere of 100% Ar gas, and then the temperature was increased to 1150° C., which was maintained for one hour. Thereafter, in an atmosphere of argon-based 1% oxygen, the temperature was increased to 1350° C., which was maintained for four hours. The temperature was maintained for another four hours in an atmosphere of 70% oxygen and was then decreased to 700° C. Subsequently, the surface oxide films were removed in a HF aqueous solution and subjected to SC-1 cleaning to produce final SIMOX products. These SIMOX substrates are grouped in Example 1.

EXAMPLE 2

Figure 2:
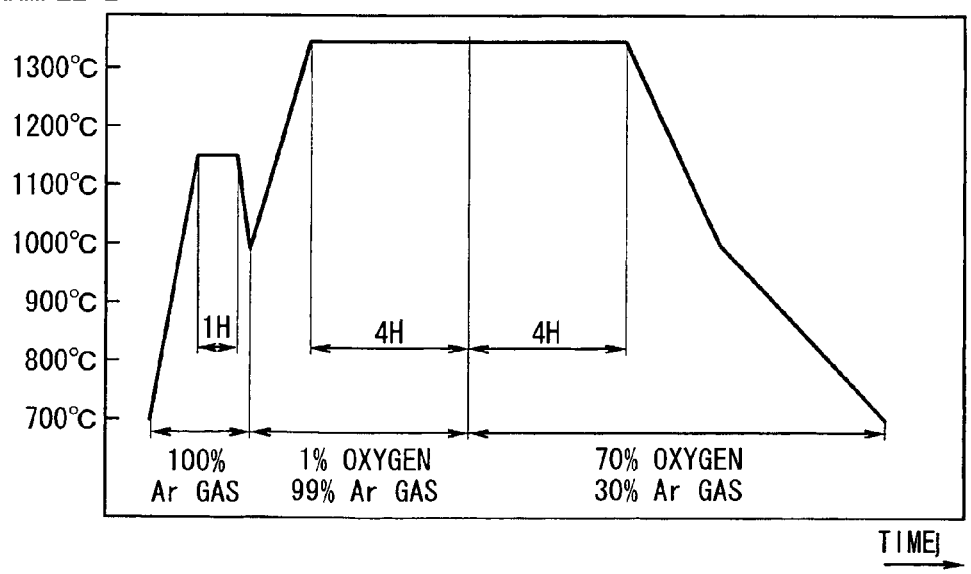
FIG. 2 is a diagram depicting temperature conditions in Example 2 according to an embodiment of this invention.

The same substrates as those three types in Example 1 were prepared. Oxygen ions were implanted into these three types of substrates under the same conditions as those in Example 1. Next, as shown in FIG. 2, a temperature of 700° C. was achieved in an atmosphere of 100% Ar gas, and then the temperature was increased to 1150° C., which was maintained for one hour. Thereafter, the temperature was decreased to 1000° C. Thereafter, in an atmosphere of argon-based 1% oxygen, the temperature was increased to 1350° C., which was maintained for four hours. The temperature was maintained for another four hours in an atmosphere of 70% oxygen and was then decreased to 700° C. Subsequently, the surface oxide films were removed in an HF aqueous solution and subjected to SC-1 cleaning to produce final SIMOX products. These SIMOX substrates are grouped in Example 2.

COMPARATIVE EXAMPLE 1

Figure 3:
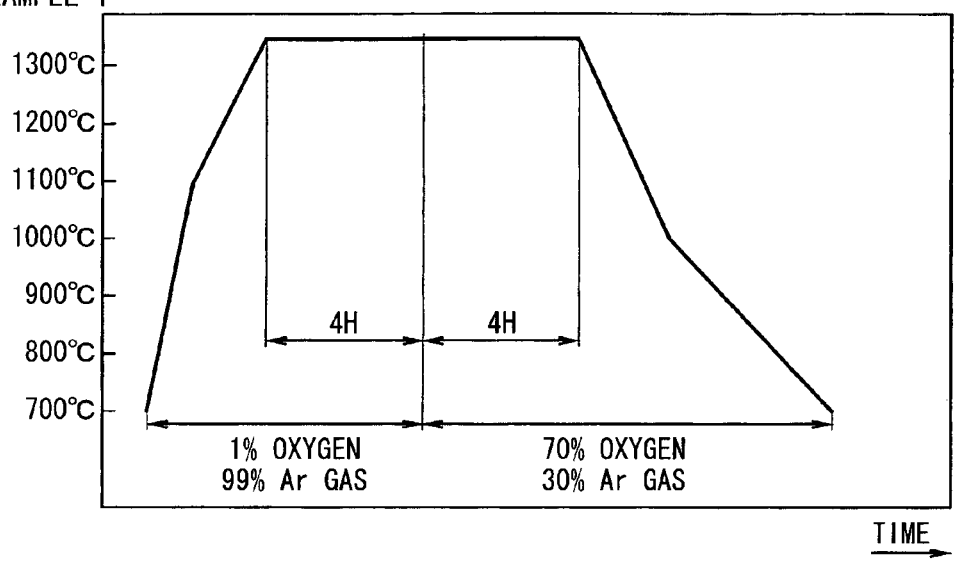
FIG. 3 is a diagram depicting temperature conditions in Comparative Example 1 according to an embodiment of this invention.

The same substrates as those three types in Example 1 were prepared. Oxygen ions were implanted into these three types of substrates under the same conditions as those in Example 1. Next, as shown in FIG. 3, a temperature of 700° C. was achieved, and then, in an atmosphere of argon-based 1% oxygen, the temperature was increased to 1350° C., which was maintained for four hours. The temperature was maintained for another four hours in an atmosphere of 70% oxygen and was then decreased to 700° C. Subsequently, the surface oxide films were removed in an HF aqueous solution and subjected to SC-1 cleaning to produce final SIMOX products. These SIMOX substrates are grouped in Comparative Example 1.

Evaluation Test and Evaluation

The substrates (1) to (3) in Example 1, Example 2, and Comparative Example 1 were checked using a surface-defect detection apparatus. The results are as described below.

In Comparative Example 1, pits were observed in areas where COPs existed on the initial substrates (observed densely around the center of the substrates). As seen in the substrate (3), the higher the crystal defect density, the higher the pit density. More specifically, about ten or more defects per cm$^2$ existed on the SIMOX products surface. Furthermore, the surface haze level measured a value of about 1 to 4 ppb for all samples.

In Example 1, on the other hand, measurements of the haze level were in a variation of about 1 ppb to 1020 ppb for all samples in the heat treatment furnace, although all substrates (1) to (3) had 0.3 to 0.5 pits per cm$^2$. In particular, at the lower portions of the boat, the more significant degradation of haze was observed.

In Example 2, all substrates (1) to (3) had 0.3 to 0.5 pits per cm$^2$, and measurements of the haze level were in a variation of about 1 ppb to 5 ppb for all samples. These measurements are equivalent to those of the conventional SIMOX product.

Consequently, from the above-described results, this invention allows a SIMOX substrate based on a low-cost substrate to exhibit the same level of quality as that of a SIMOX substrate based on a costly substrate.

INDUSTRIAL APPLICABILITY

In the manufacturing method for a SIMOX substrate, an inner-wall oxide film of crystal defects resulting from heat treatment in an atmosphere of non-oxidizing gas, particularly void defects called grown-in defects, is dissolved, and thereafter grown-in defects adjacent to the surface can be reduced and eliminated by drawing upon a gap-filling effect by diffusion of interstitial silicon atoms in void defects where the inner-wall oxide film has been removed.

What is claimed is:

1. A manufacturing method for a SIMOX substrate for obtaining a SIMOX substrate by subjecting a silicon substrate having oxygen ions implanted thereinto by heat treatment at 1300 to 1350° C. in an atmosphere of a gas mixture of argon and oxygen, the method comprising:
   performing a pre-heat-treatment to the silicon substrate for five minutes to four hours within the temperature range of 1000° C. to 1280° C. in an atmosphere of inert gas, reducing gas, or a gas mixture of inert gas and reducing gas, after the oxygen ions are implanted and before the heat treatment is performed; wherein
   the silicon substrate having the oxygen ions implanted thereinto have crystal defect densities of void defects or COPs greater than or equal to $1 \times 10^5$ cm$^{-3}$ and a maximum frequency less than or equal to 0.12 μm in the size distribution of the crystal defects.

2. The manufacturing method for a SIMOX substrate according to claim 1, further comprising:
   decreasing the temperature of the silicon substrate to 600° C. to 1100° C. in an atmosphere of inert gas, reducing gas, or a gas mixture of inert gas and reducing gas, after the pre-heat-treatment; and
   performing the heat treatment in an atmosphere of a gas mixture of argon and oxygen, after the decreasing of the temperature of the silicon substrate.

* * * * *